(12) United States Patent
Chen et al.

(10) Patent No.: US 9,258,923 B2
(45) Date of Patent: Feb. 9, 2016

(54) ADJUSTABLE BRACKET ASSEMBLY AND SLIDE ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 131 days.

(21) Appl. No.: 14/148,946

(22) Filed: Jan. 7, 2014

(65) Prior Publication Data

US 2015/0189989 A1   Jul. 9, 2015

(51) Int. Cl.
*A47B 88/04*   (2006.01)
*H05K 7/14*   (2006.01)

(52) U.S. Cl.
CPC .................... *H05K 7/1489* (2013.01)

(58) Field of Classification Search
USPC ............... 248/221.11, 298.1, 222.41, 222.11, 248/220.21, 224.8; 312/333, 334.1, 334.4
See application file for complete search history.

(56) References Cited

U.S. PATENT DOCUMENTS

| | | | |
|---|---|---|---|
| 6,554,142 B2 | 4/2003 | Gray | |
| 6,655,534 B2 | 12/2003 | Williams et al. | |
| 7,188,916 B2 | 3/2007 | Silvestro et al. | |
| 7,281,694 B2 | 10/2007 | Allen et al. | |
| 8,328,300 B2 * | 12/2012 | Yu et al. | 312/333 |
| 8,353,494 B2 * | 1/2013 | Peng et al. | 248/298.1 |
| 8,371,542 B2 * | 2/2013 | Zhang et al. | 248/220.21 |
| 2008/0303398 A1 * | 12/2008 | Hsiung et al. | 312/334.46 |
| 2012/0257845 A1 * | 10/2012 | Fan et al. | 384/35 |
| 2012/0312943 A1 * | 12/2012 | Fan | 248/222.11 |

* cited by examiner

*Primary Examiner* — Steven Marsh
(74) *Attorney, Agent, or Firm* — Rosenberg, Klein & Lee

(57) ABSTRACT

An adjustable bracket for a slide assembly includes a bracket, a support member and an engaging member. The bracket has an aperture and a contact portion. The support member is slidably connected to the bracket and has an opening and a stop portion. The engaging member has a resilient arm and an engaging portion which is connected to the resilient arm and located corresponding to the aperture of the bracket. When the support member slides to a predetermined position, the stop portion is against the contact portion so that the support member is stopped. When the support member slides to an extended position, the opening overlaps the aperture and the engaging portion is inserted into the opening so that the support member is positioned.

9 Claims, 8 Drawing Sheets

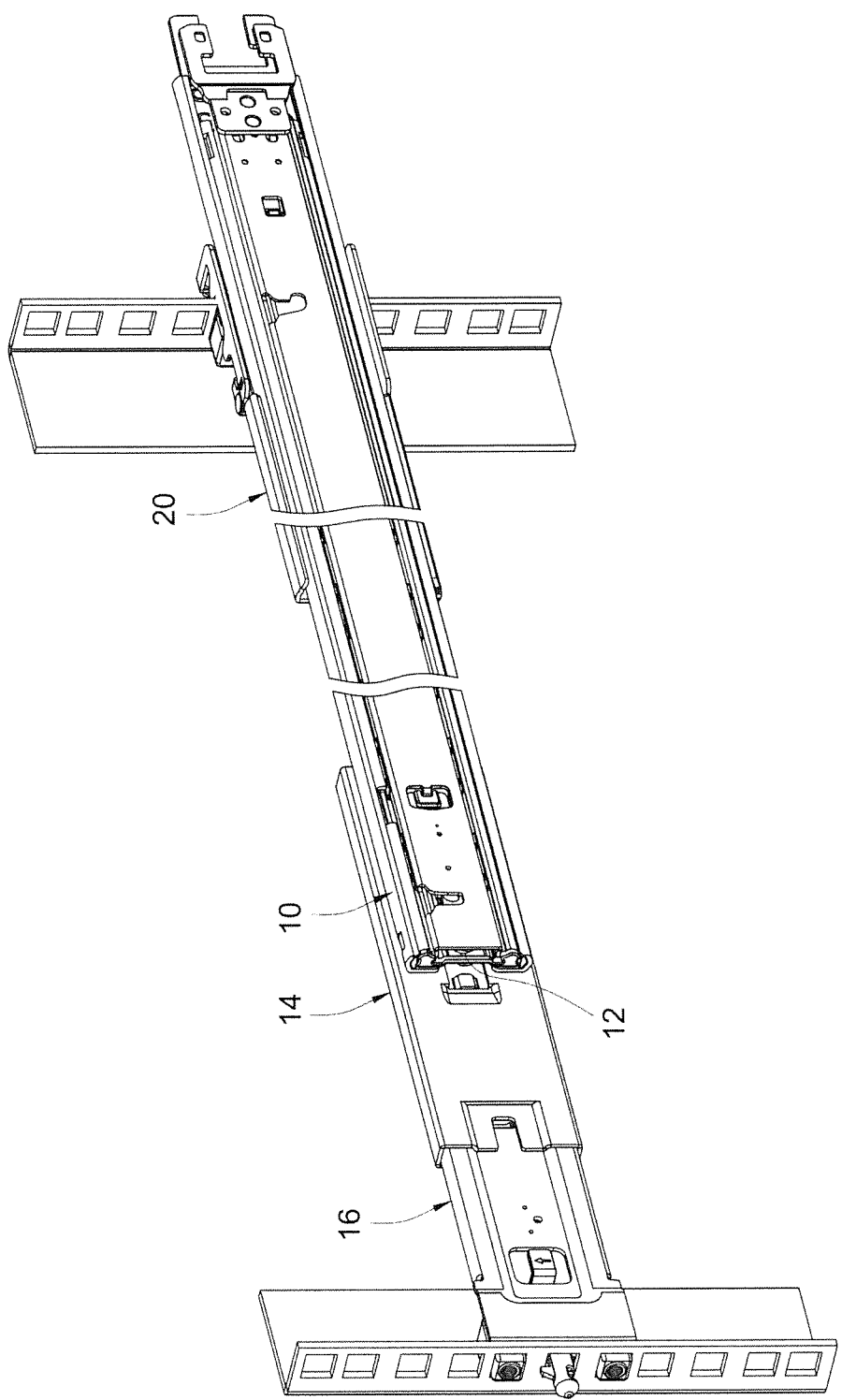

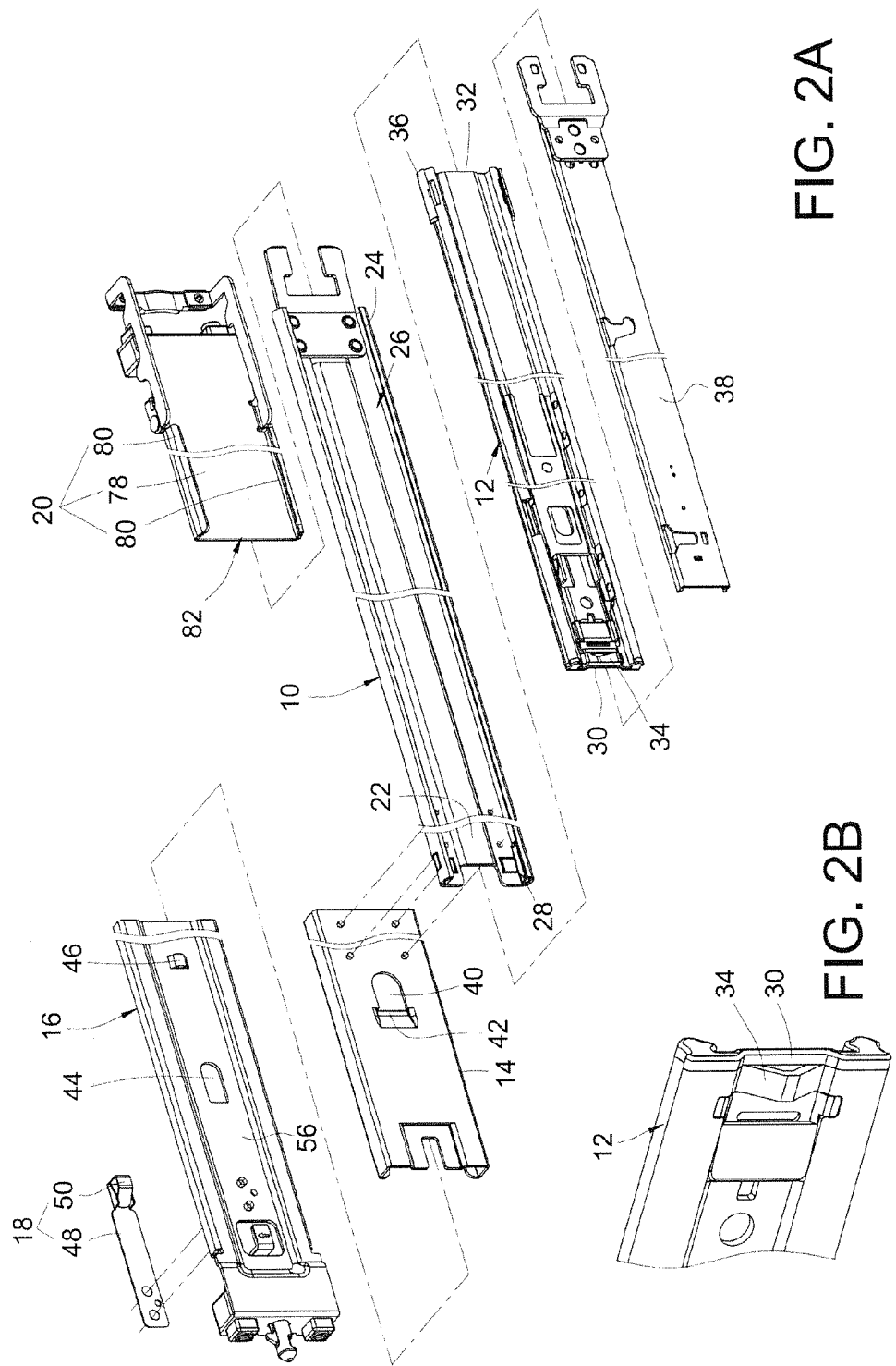

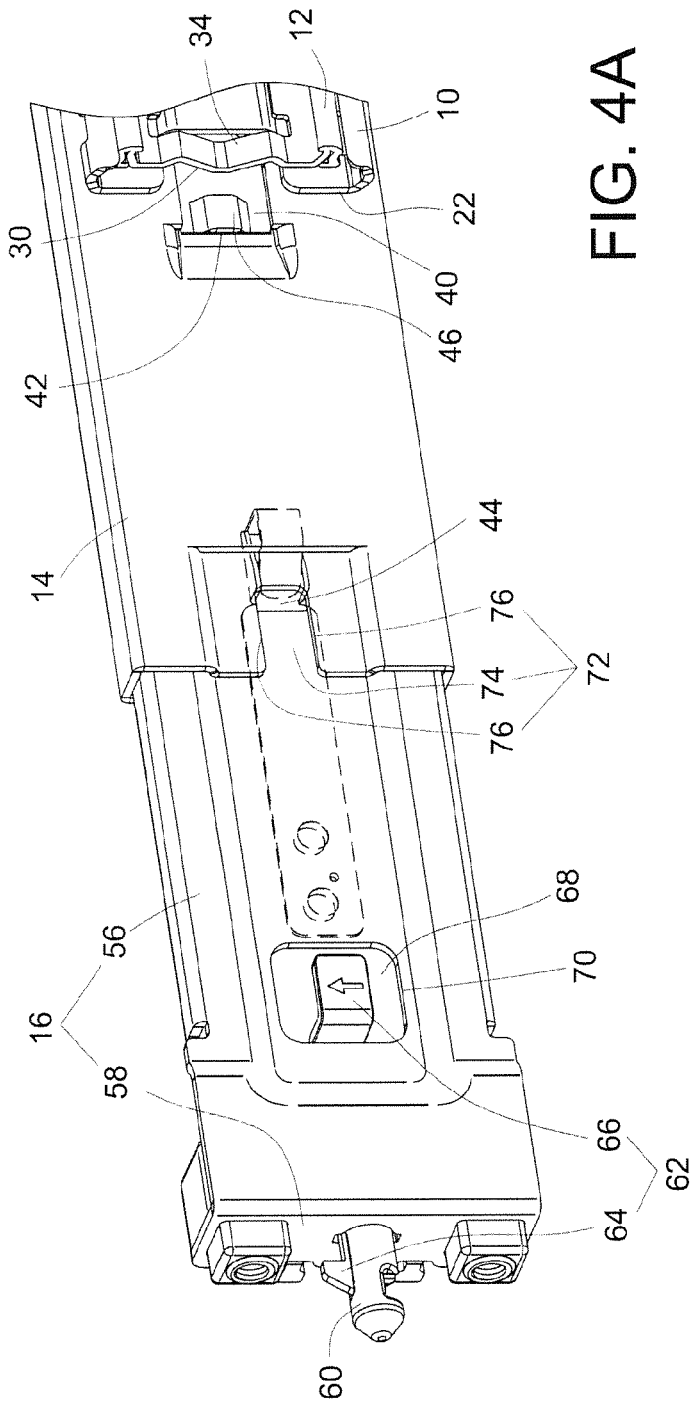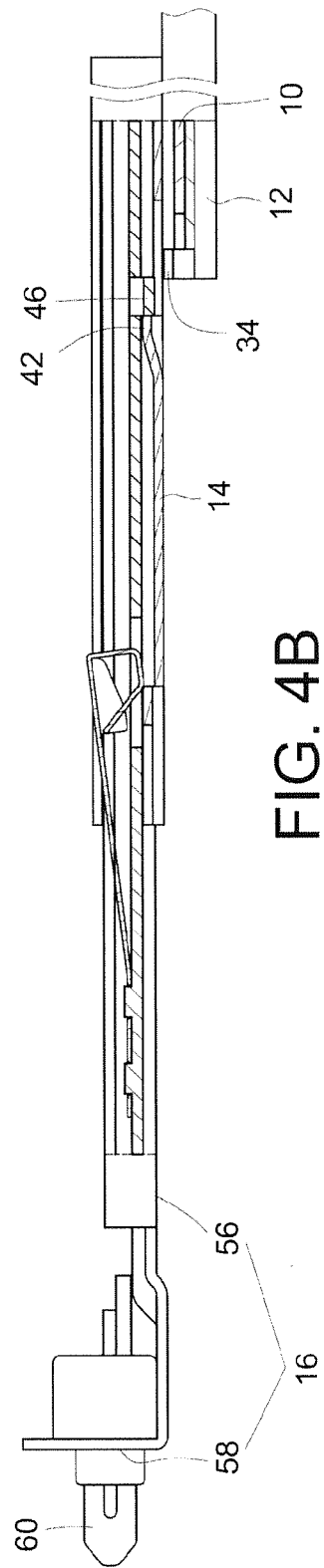

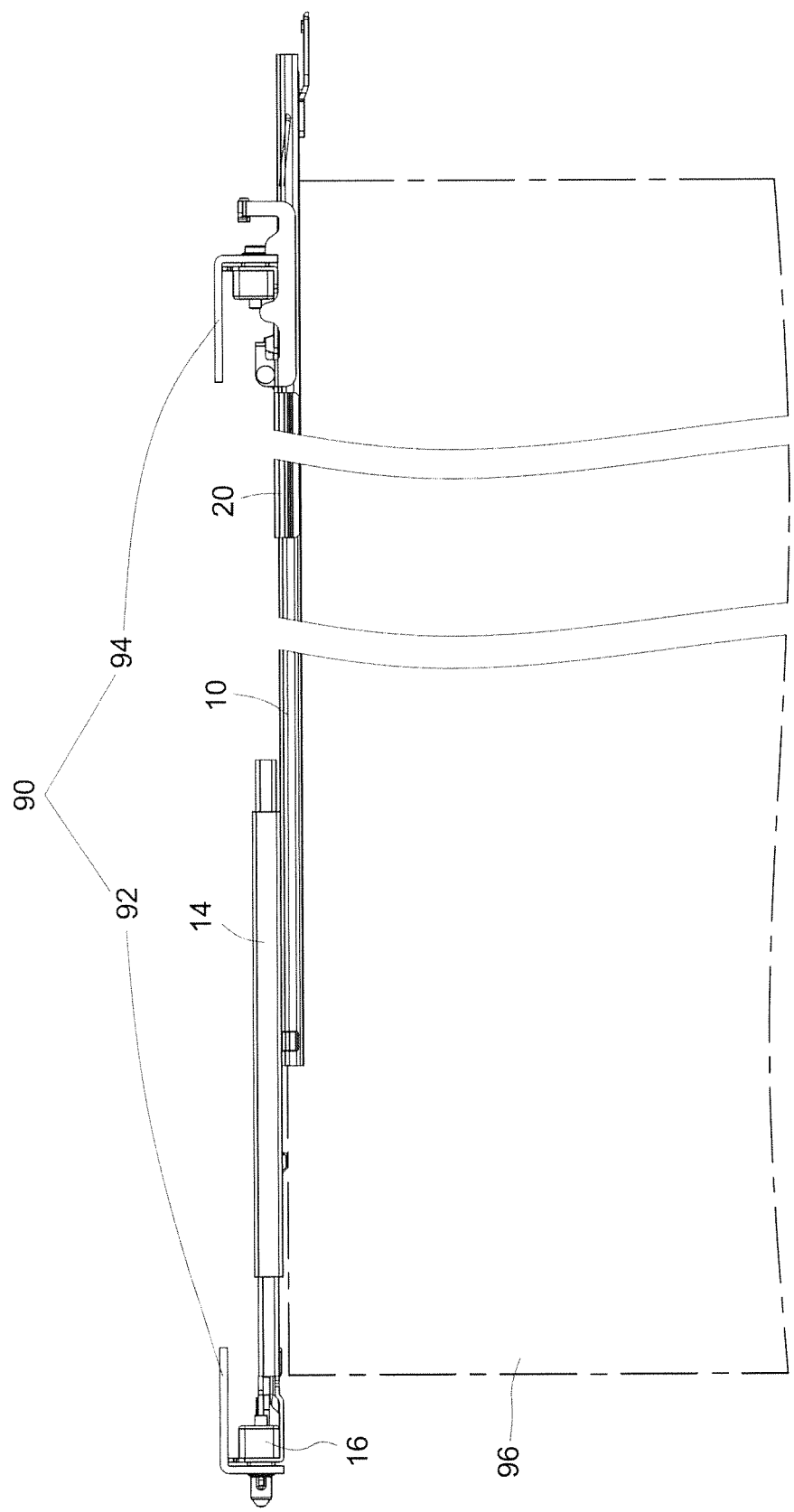

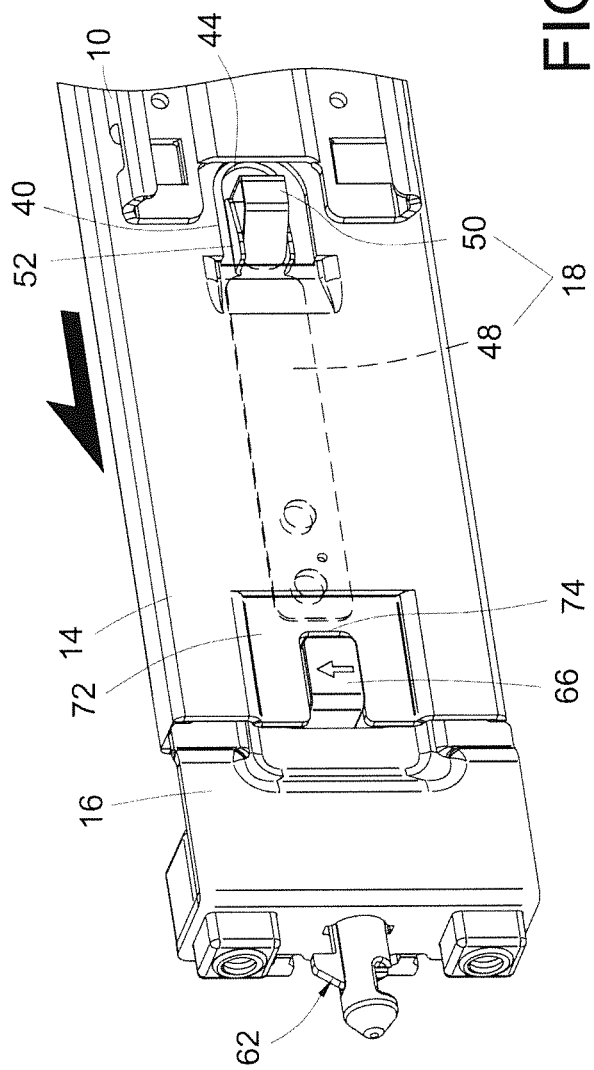
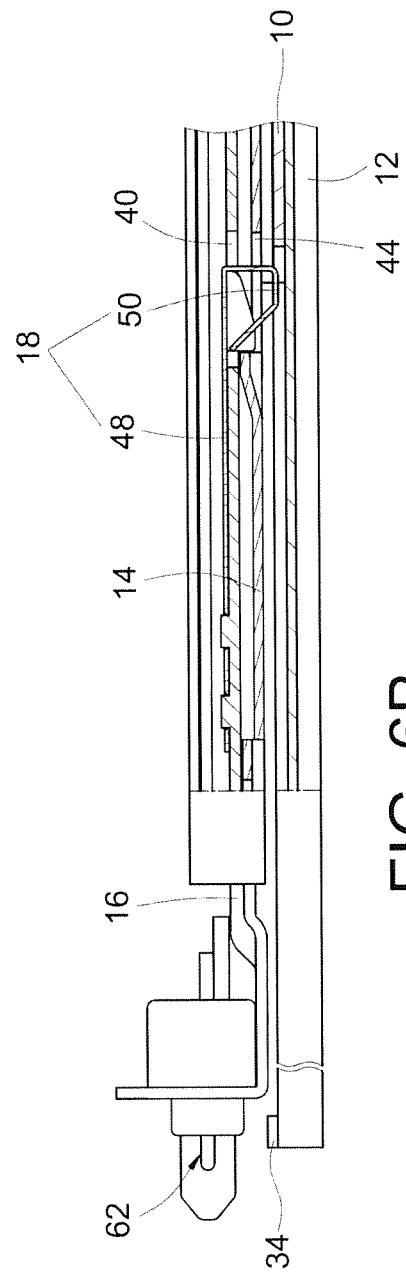
FIG. 6A
FIG. 6B

ADJUSTABLE BRACKET ASSEMBLY AND SLIDE ASSEMBLY

FIELD OF THE INVENTION

The present invention relates to a bracket assembly, and more particularly, to an adjustable bracket assembly used with a slide assembly.

BACKGROUND OF THE INVENTION

U.S. Pat. No. 7,281,694 B2 to Allen et al. has disclosed a conventional slide assembly used with a servo chassis and is herein incorporated by reference. The conventional slide assembly is installed to a rack which has two posts on each of two sides thereof. There is a pre-set distance between the two posts which is set according to the depth of the rack, and the slide assembly is installed between the two posts and comprises an outer rail, a middle rail, an inner rail, a front bracket and a rear bracket. The outer rail has a front end and a rear end. The middle rail is slidably connected to the outer rail, and the inner rail is slidably connected to the middle rail. The front bracket is fixed to the front end of the outer rail, and the rear bracket is fixed to the rear end of the outer rail. The slide assembly is connected to the two posts by the front and rear brackets.

However, the modern servos are developed toward a high density mode which means that more parts are required to be installed in a limited space. Therefore, the arrangement of the operation space of the rails becomes a concern, and the related parts of the slide assembly need to be adjusted so as to meet the requirement of installation of the modern servos to the rack.

The present invention intends to provide an adjustable bracket assembly for a slide assembly.

SUMMARY OF THE INVENTION

The present invention provides an adjustable bracket assembly, which comprises a bracket, a support member and an engaging member. The bracket has an aperture and a contact portion. The support member is slidably connected to the bracket and has an opening and a stop portion which is shaped corresponding to the contact portion. The engaging member is connected to the bracket and has a resilient arm and an engaging portion. The engaging portion is connected to the resilient arm and located corresponding to the aperture of the bracket. When the support member slides to a predetermined position on a rear end of the bracket, the contact portion is against the stop portion of the support member so that the support member is stopped, and when the support member slides to an extended position on a front end of the bracket, the opening overlaps the aperture and the engaging portion of the engaging member is inserted into the opening of the support member by a force from the resilient arm so that the support member is positioned.

Preferably, the stop portion of the support member is located on an edge of the opening so that when the engaging portion of the engaging member is inserted into the opening of the support member, the engaging portion is against the stop portion.

Preferably, the engaging portion extends from the resilient arm and has an engaging face which is perpendicular to the resilient arm for engaging with the opening, and wherein a release slant extends from an end of the engaging portion towards the resilient arm and faces the aperture of the bracket.

Preferably, the bracket has a sidewall and an end plate which is substantially perpendicular to the sidewall, the aperture and the contact portion are located on the sidewall, an installation member is connected to the end plate and is connected to a movable connection member, the connection member has a connection portion and a release portion, the release portion is operated via an operation space to move the connection portion, the sidewall has a through hole through which the release portion extends, the support member has a fixing portion, and when the support member is positioned by the engaging portion of the engaging member, the fixing portion overlaps the operation space for restricting an operation of the release portion.

Preferably, the connection member is pivotable relative to the installation member, the fixing portion of the support member has a notch which is bounded by two stop walls, and when the fixing portion overlaps the operation space, the release portion of the connection member is inserted into the notch and flanked by the stop walls.

The present invention also provides a slide assembly, which comprises a first rail, a second rail, a support member, a first bracket, an engaging member and a second bracket. The first rail has a front end, a rear end, a path and a first restriction portion which is located in the path and adjacent to the front end. The second rail is slidably connected to the first rail. The second rail has a front end, a rear end, a release member and a second restriction portion. The release member is located adjacent to the front end of the second rail. The second restriction portion is located adjacent to the rear end of the second rail and corresponding to the first restriction portion of the first rail. The support member is located adjacent to the front end of the first rail and has an opening and a stop portion. The first bracket is slidably connected to the support member and has an aperture and a contact portion. The contact portion is shaped corresponding to the stop portion of the support member. The engaging member is connected to the first bracket and has a resilient arm and an engaging portion connected to the resilient arm. The engaging portion is located corresponding to the aperture of the first bracket. The second bracket slidably connected to the rear end of the first rail. When the second rail is pulled relative to the first rail to a extreme position at which the second restriction portion of the second rail is against the first restriction portion of the first rail, the second rail is allowed to lead the first rail and the support member to slide toward a front end of the first bracket to reach an extended position at which the opening overlaps the aperture so that the engaging portion of the engaging member is inserted into the opening of the support member by a force from the resilient arm and the support member is positioned. When the second rail is retracted relative to the first rail, the second rail is allowed to release the engaging portion of the engaging member from the opening of the support member by the release member so as to lead the first rail and the support member to slide toward a rear end of the first bracket until the stop portion is against and stopped by the contact portion.

Preferably, the stop portion of the support member is located on an edge of the opening so that when the engaging portion of the engaging member is inserted into the opening of the support member, the engaging portion is against the stop portion.

Preferably, the engaging portion extends from the resilient arm and has a engaging face which is perpendicular to the resilient arm for engaging with the opening, a release slant extends from an end of the engaging portion toward the resilient arm and faces the aperture of the first bracket, and when the second rail is retracted relative to the first rail to a position, the release member of the second rail pushes the engaging portion along the release slant to release the engaging portion from the opening.

Preferably, the first bracket has a sidewall and an end plate which is perpendicular to the sidewall, the aperture and the contact portion are located on the sidewall, an installation member is connected to the end plate and a movable connection member is connected to the installation member, the connection member has a connection portion and a release portion, the release portion is operated via an operation space to move the connection portion, the sidewall has a through hole through which the release portion extends, the support member has a fixing portion, and when the support member is positioned by the engaging portion of the engaging member, the fixing portion overlaps the operation space for restricting an operation of the release portion.

Preferably, the connection member is pivotable relative to the installation member, the fixing portion of the support member has a notch which is bounded by two stop walls, and when the fixing portion overlaps the operation space, the release portion of the connection member is inserted into the notch and flanked by the two stop walls.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 1 is a perspective view of a slide assembly in accordance with a preferred embodiment of the present invention, wherein the slide assembly is connected to a rack;

FIG. 2A is an exploded view of the slide assembly in accordance with the preferred embodiment of the present invention;

FIG. 2B shows the second rail of the slide assembly in accordance with the preferred embodiment of the present invention;

FIG. 4A is a perspective view of the slide assembly in accordance with the preferred embodiment of the present invention, wherein the slide assembly is in a retracted status;

FIG. 4B is a top cross sectional view of the slide assembly in accordance with the preferred embodiment of the present invention, wherein the slide assembly is in the retracted status;

FIG. 5 is a top view of the slide assembly in accordance with the preferred embodiment of the present invention, wherein the slide assembly is connected between the rack and a chassis;

FIG. 6A is a perspective view of the slide assembly in accordance with the preferred embodiment of the present invention, wherein the slide assembly is in an extended status;

FIG. 6B is a top cross sectional view of the slide assembly in accordance with the preferred embodiment of the present invention, wherein the slide assembly is in the extended status;

DETAILED DESCRIPTION OF THE PREFERRED EMBODIMENT

Figure 3A:
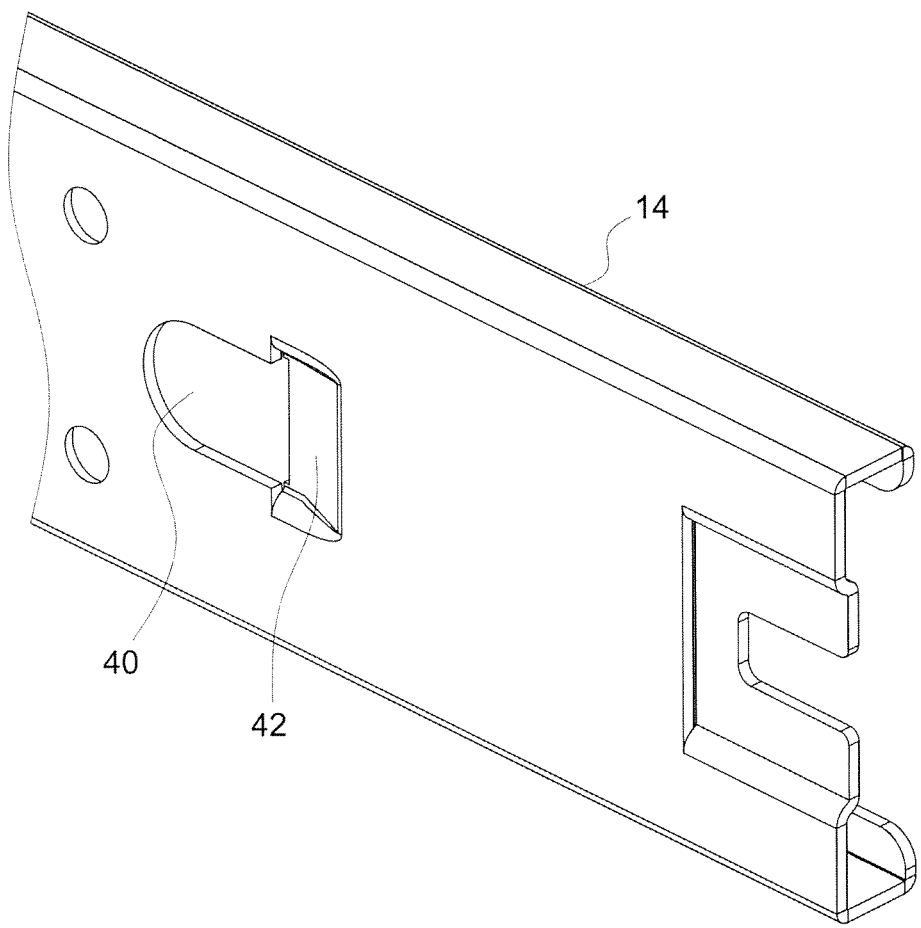
FIG. 3A shows the support member of the slide assembly in accordance with the preferred embodiment of the present invention.

Referring to FIGS. 1, 2A and 2B, a slide assembly of a preferred embodiment of the present invention comprises a first rail 10, a second rail 12, a support member 14, a first bracket 16, an engaging member 18 and a second bracket 20.

The first rail 10 has a front end 22, a rear end 24, a path 26 and a first restriction portion 28 which is located in the path 26 and adjacent to the front end 22.

The second rail 12 is slidably connected to the first rail 10 and has a front end 30, a rear end 32, a release member 34 and a second restriction portion 36. The release member 34 is located adjacent to the front end 30 of the second rail 12.

The second restriction portion 36 is located adjacent to the rear end 32 of the second rail 12 and is located corresponding to the first restriction portion 28 of the first rail 10. When the second rail 12 is pulled out relative to the first rail 10 to a extreme position, the second restriction portion 36 of the second rail 12 is against the first restriction portion 28 of the first rail 10 so that the second rail 12 can lead the first rail 10 to move toward a front end of the first bracket 16. Preferably, a third rail 38 is slidably connected to the second rail 12 such that the slide assembly can be further extended to a longer distance.

The support member 14 is located adjacent to the front end 22 of the first rail 10 and has an opening 40 and a stop portion 42. In detail, the support member 14 and the first rail 10 can be two individual parts which are connected to each other by way of riveting, threading or any known method, to let the support member 14 be located adjacent to the front end 22 of the first rail 10.

The first bracket 16 is slidably connected to the support member 14 and has an aperture 44 and a contact portion 46. The contact portion 46 is shaped corresponding to the stop portion 42 of the support member 14. As shown in FIG. 4A, when the support member 14 moves toward a rear end of the first bracket 16 and reaches a predetermined position (as shown in FIG. 4A), the contact portion 46 is against the stop portion 42 of the support member 14 so that the support member 14 is stopped.

The engaging member 18 is fixed to the first bracket 16 and has a resilient arm 48 and an engaging portion 50. The engaging portion 50 is connected to the resilient arm 48 and located corresponding to the aperture 44 of the first bracket 16. When the opening 40 of the support member 14 overlaps the aperture 44 of the first bracket 16, the engaging portion 50 of the engaging member 18 can be inserted into the opening 40 of the support member 14 by a force from the resilient arm 48 or be released from the opening 40 of the support member 14 by the release member 34 of the second rail 12. In detail, the engaging member 18 and the first bracket 16 can be two individual parts which are connected to each other by way of riveting, threading or any known method, to let the engaging member 18 be connected to the first bracket 16.

Figure 3B:
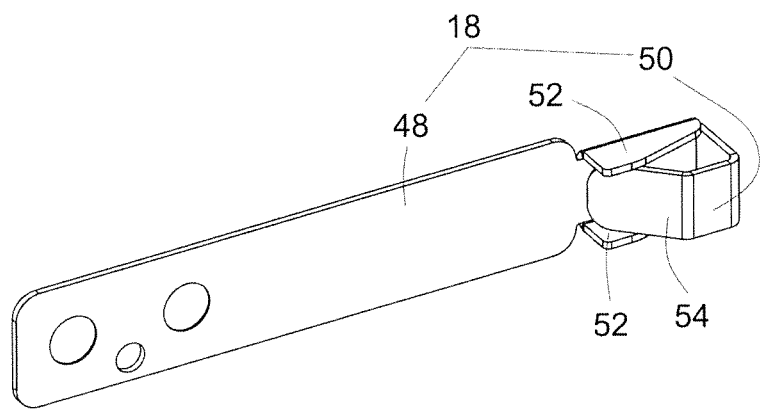
FIG. 3B is an enlarged view of the engaging member of the slide assembly in accordance with the preferred embodiment of the present invention.

Referring to FIG. 3A, the stop portion 42 of the support member 14 is located on an edge of the opening 40 of the support member 14 so that when the engaging portion 50 of the engaging member 18 is inserted into the opening 40 of the support member 14, the engaging portion 50 is against the stop portion 42 and stuck in the opening 40 of the support member 14. Further referring to FIG. 3B, the engaging portion 50 extends from the resilient arm 48 and has a engaging face 52 which is perpendicular to the resilient arm 48 for engaging with the opening 40 of the support member 14. Moreover, a release slant 54 extends from an end of the engaging portion 50 toward the resilient arm 48 and faces the aperture 44 of the first bracket 16.

As shown in FIGS. 4A and 4B, preferably, the first bracket 16 has a sidewall 56 and an end plate 58 which is perpendicular to the sidewall 56. The sidewall 56 has the aperture 44 defined therein, and the contact portion 46 extends from the sidewall 56. That is, the aperture 44 and the contact portion 46 both are located on the side wall 56. An installation member 60 is connected to the end plate 58, and a movable connection member 62 is connected to the installation member 60. The connection member 62 has a connection portion 64 and a release portion 66.

The release portion 66 can be operated via an operation space 68 to move the connection portion 64. The sidewall 56 has a through hole 70 through which the release portion 66 extends. The support member 14 has a fixing portion 72. Specifically, the movable connection member 62 is pivotable relative to the installation member 60, the fixing portion 72 of the support member 14 has a notch 74 which is bounded by two stop walls 76, and when the notch 74 of the fixing portion 72 overlaps the operation space 68, the release portion 66 of the connection member 62 is inserted into the notch 74 and flanked by the stop walls 76, thereby restricting an operation of the release portion 66.

The second bracket 20 is slidably connected to the rear end 24 of the first rail 10. Specifically, the second bracket 20 has a side plate 78 which has a pair of bent portions 80, and a path 82 is bounded by the two bent portions 80 such that the rear end 24 of the first rail 10 can be inserted into the path 82 and slide relative to the second bracket 20.

FIG. 5 is a top view of the slide assembly, wherein the slide assembly is connected to a first post 92 of a rack 90 by the first bracket 16 and connected to a second post 94 of the rack 90 by the second bracket 20, and one side of a chassis 96 is positioned on the slide assembly.

Figure 7:
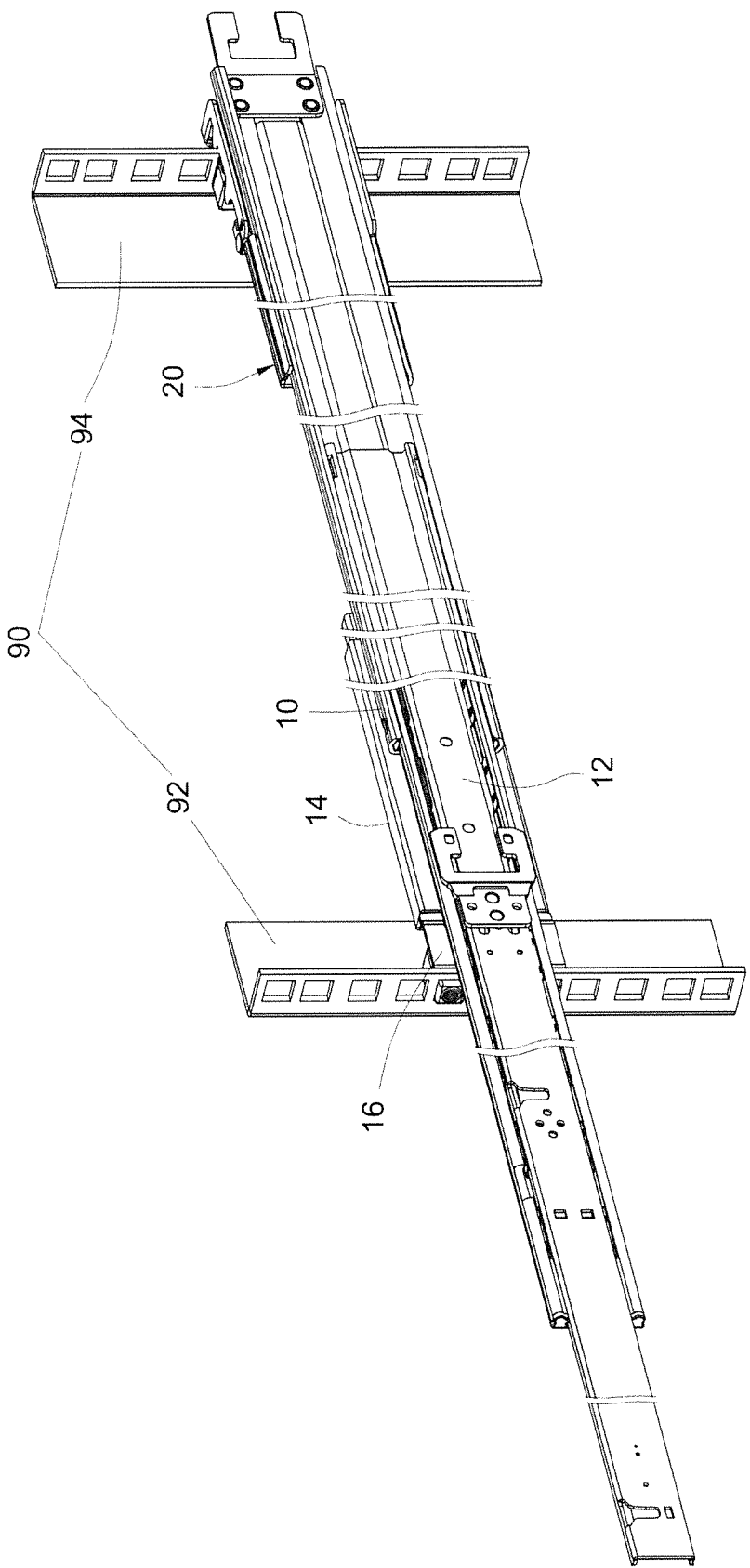
FIG. 7 is a perspective view of the slide assembly in accordance with the preferred embodiment of the present invention, wherein the slide assembly is connected to the rack and is in the extended status.

FIGS. 6A and 6B are a perspective view and a top cross section view, respectively, of the slide assembly, wherein the slide assembly is in an extended status. In the extended status, the first rail 10 and the support member 14 are led by the second rail 12 to move toward the front end of the first bracket 16, and when the opening 40 of the support member 14 overlaps the aperture 44 of the first bracket 16, the engaging portion 50 of the engaging member 18 is inserted into the opening 40 of the support member 14 by a force from the resilient arm 48 and against the stop portion 42 of the support member 14 to be stuck in the opening 40; in more detail, the engaging face 52 of the engaging portion 50 is engaged with the opening 40 of the support member 14, and thus the support member 14 is positioned. In other words, the support member 14 can be positioned after sliding toward the front end of the first bracket 16 for a distance. Moreover, since the first rail 10 and the support member 14 are connected to move simultaneously, the first rail 10 also can be positioned after sliding, together with the support member 14, toward the front end of the first bracket 16 for a distance as shown in FIG. 7. The first rail 10 and the support member 14 can be moved from the predetermined position (as shown in FIG. 4A) to an extended position (as shown in FIG. 6A) such that the extended length of the slide assembly is adjustable to provide sufficient space for the installation of the chassis 96, which is installed on the rack 90 as shown in FIG. 5.

Furthermore, as shown in FIGS. 6A and 6B, when the support member 14 slides toward the front side of the first bracket 16 and is positioned at the extended position, the notch 74 of the fixing portion 72 of the support member 14 overlaps the operation space 68 such that the release portion 66 of the connection member 62 of the first bracket 16 is flanked by the two stop walls 76 of the fixing portion 72 and thus the operation of the release portion 66 is restricted, whereby ensuring that the connection portion 64 of the connection member 62 (in FIG. 4A) to be hooked to the first post 92 of the rack 90 to prevent the slide assembly from dropping from the rack 90 and to prevent the chassis 96 from dropping to the ground and damaged.

Figure 8:
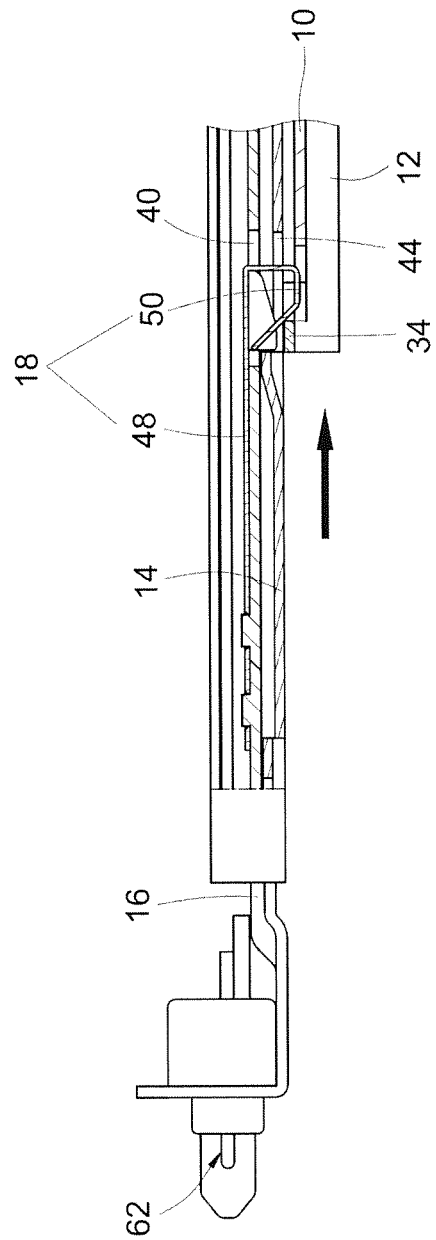
FIG. 8 is a schematic view showing retraction of the second rail of the slide assembly in accordance with the preferred embodiment of the present invention.

Further referring to FIG. 8, when the second rail 12 is retracted toward the rear end of the first bracket 16 to collapse the slide assembly, the release member 34 of the second rail 12 pushes the engaging portion 50 along the release slant 54, so that the engaging portion 50 of the engaging member 18 is released from the opening 40 of the support member 14, thereby, the support member 14 can move back to the predetermined position as shown in FIG. 4A.

While we have shown and described the embodiment in accordance with the present invention, it should be clear to those skilled in the art that further embodiments may be made without departing from the scope of the present invention.

What is claimed is:

1. An adjustable bracket assembly comprising:
a bracket having an aperture and a contact portion;
a support member slidably connected to the bracket and having an opening and a stop portion which is shaped corresponding to the contact portion; and
an engaging member connected to the bracket and having a resilient arm and an engaging portion, the engaging portion connected to the resilient arm and located corresponding to the aperture of the bracket;
wherein when the support member slides to a predetermined position on a rear end of the bracket, the contact portion is against the stop portion of the support member so that the support member is stopped, and when the support member slides to an extended position on a front end of the bracket, the opening overlaps the aperture and the engaging portion of the engaging member is inserted into the opening of the support member by a force from the resilient arm so that the support member is positioned;
wherein the bracket has a sidewall and an end plate which is substantially perpendicular to the sidewall, the aperture and the contact portion are located on the sidewall, an installation member is connected to the end plate and is connected to a movable connection member, the connection member has a connection portion and a release portion, the release portion is operated via an operation space to move the connection portion, the sidewall has a through hole through which the release portion extends, the support member has a fixing portion, and when the support member is positioned by the engaging portion of the engaging member, the fixing portion overlaps the operation space for restricting an operation of the release portion.

2. The bracket assembly as claimed in claim 1, wherein the stop portion of the support member is located on an edge of the opening so that when the engaging portion of the engaging member is inserted into the opening of the support member, the engaging portion is against the stop portion.

3. The bracket assembly as claimed in claim 1, wherein the engaging portion extends from the resilient arm and has an engaging face which is perpendicular to the resilient arm for engaging with the opening, and wherein a release slant extends from an end of the engaging portion towards the resilient arm and faces the aperture of the bracket.

4. The bracket assembly as claimed in claim 1, wherein the connection member is pivotable relative to the installation member, the fixing portion of the support member has a notch which is bounded by two stop walls, and when the fixing portion overlaps the operation space, the release portion of the connection member is inserted into the notch and flanked by the stop walls.

5. A slide assembly comprising:
a first rail having a front end, a rear end, a path and a first restriction portion which is located in the path and adjacent to the front end;
a second rail slidably connected to the first rail, the second rail having a front end, a rear end, a release member and a second restriction portion, the release member located adjacent to the front end of the second rail, the second restriction portion located adjacent to the rear end of the second rail, the second restriction portion located corresponding to the first restriction portion of the first rail;
a support member located adjacent to the front end of the first rail and having an opening and a stop portion;
a first bracket slidably connected to the support member and having an aperture and a contact portion, the contact portion shaped corresponding to the stop portion of the support member;
an engaging member connected to the first bracket and having a resilient arm and an engaging portion connected to the resilient arm, the engaging portion located corresponding to the aperture of the first bracket; and
a second bracket slidably connected to the rear end of the first rail;
wherein when the second rail is pulled relative to the first rail to a extreme position at which the second restriction portion of the second rail is against the first restriction portion of the first rail, the second rail is allowed to lead the first rail and the support member to slide toward a front end of the first bracket to reach an extended position at which the opening overlaps the aperture so that the engaging portion of the engaging member is inserted into the opening of the support member by a force from the resilient arm and the support member is positioned, and wherein when the second rail is retracted relative to the first rail, the second rail is allowed to release the engaging portion of the engaging member from the opening of the support member by the release member so as to lead the first rail and the support member to slide toward a rear end of the first bracket until the stop portion is against and stopped by the contact portion.

6. The slide assembly as claimed in claim 5, wherein the stop portion of the support member is located on an edge of the opening so that when the engaging portion of the engaging member is inserted into the opening of the support member, the engaging portion is against the stop portion.

7. The slide assembly as claimed in claim 5, wherein the engaging portion extends from the resilient arm and has an engaging face which is perpendicular to the resilient arm for engaging with the opening, a release slant extends from an end of the engaging portion toward the resilient arm and faces the aperture of the first bracket, and when the second rail is retracted relative to the first rail to a position, the release member of the second rail pushes the engaging portion along the release slant to release the engaging portion from the opening.

8. The slide assembly as claimed in claim 5, wherein the first bracket has a sidewall and an end plate which is perpendicular to the sidewall, the aperture and the contact portion are located on the sidewall, an installation member is connected to the end plate and a movable connection member is connected to the installation member, the connection member has a connection portion and a release portion, the release portion is operated via an operation space to move the connection portion, the sidewall has a through hole through which the release portion extends, the support member has a fixing portion, and when the support member is positioned by the engaging portion of the engaging member, the fixing portion overlaps the operation space for restricting an operation of the release portion.

9. The slide assembly as claimed in claim 8, wherein the connection member is pivotable relative to the installation member, the fixing portion of the support member has a notch which is bounded by two stop walls, and when the fixing portion overlaps the operation space, the release portion of the connection member is inserted into the notch and flanked by the two stop walls.

* * * * *